(12) United States Patent
Zhang et al.

(10) Patent No.: US 11,107,752 B2
(45) Date of Patent: Aug. 31, 2021

(54) HALF BURIED NFET/PFET EPITAXY SOURCE/DRAIN STRAP

(71) Applicant: INTERNATIONAL BUSINESS MACHINES CORPORATION, Armonk, NY (US)

(72) Inventors: Jingyun Zhang, Albany, NY (US); Ruilong Xie, Niskayuna, NY (US); Alexander Reznicek, Troy, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/733,427

(22) Filed: Jan. 3, 2020

(65) Prior Publication Data
US 2021/0210413 A1    Jul. 8, 2021

(51) Int. Cl.
*H01L 23/485*     (2006.01)
*H01L 29/06*      (2006.01)
*H01L 21/768*     (2006.01)
*H01L 29/08*      (2006.01)
*H01L 21/8234*    (2006.01)

(52) U.S. Cl.
CPC ........ *H01L 23/485* (2013.01); *H01L 21/7682* (2013.01); *H01L 21/76895* (2013.01); *H01L 21/76897* (2013.01); *H01L 21/823481* (2013.01); *H01L 29/0665* (2013.01); *H01L 29/0847* (2013.01)

(58) Field of Classification Search
CPC ........... H01L 21/76895; H01L 21/7682; H01L 21/823481
See application file for complete search history.

(56) References Cited

U.S. PATENT DOCUMENTS

| | | | |
|---|---|---|---|
| 4,876,534 A | 10/1989 | Mead et al. |
| 5,045,916 A | 9/1991 | Vor et al. |
| 7,233,032 B2 | 6/2007 | Liaw |
| 9,281,382 B2 | 3/2016 | Liu et al. |
| 9,318,382 B2 | 4/2016 | Kim |
| 9,443,982 B1 | 9/2016 | Balakrishnan et al. |
| 9,515,022 B2 | 12/2016 | Kwon et al. |
| 10,056,289 B1 | 8/2018 | Cheng et al. |

(Continued)

FOREIGN PATENT DOCUMENTS

| | | |
|---|---|---|
| JP | 2007317344 A | 12/2007 |
| JP | 2012209763 A | 10/2012 |

*Primary Examiner* — Farun Lu
(74) *Attorney, Agent, or Firm* — Tutunjian & Bitetto, P.C.; Robert Sullivan (57) ABSTRACT

A method is presented for reducing parasitic capacitance. The method includes forming a p-type epitaxial region and an n-type epitaxial region over a substrate, depositing an epitaxial growth over the p-type epitaxial region and the n-type epitaxial region, depositing a first dielectric between the p-type epitaxial region and the n-type epitaxial region such that an airgap is defined therebetween, and selectively removing the epitaxial growth to expose top surfaces of the p-type and n-type epitaxial regions. The method further includes depositing a second dielectric in direct contact with the exposed top surfaces of the p-type and n-type epitaxial regions, selectively etching the first and second dielectrics to form a strapped contact, and applying a metallization layer over the strapped contact.

16 Claims, 10 Drawing Sheets

(56) References Cited

U.S. PATENT DOCUMENTS

| | | |
|---|---|---|
| 2005/0247981 A1 | 11/2005 | Wang |
| 2014/0203376 A1 | 7/2014 | Xie et al. |
| 2016/0233298 A1 | 8/2016 | Webb et al. |
| 2018/0114792 A1 | 4/2018 | Basker et al. |
| 2020/0043796 A1* | 2/2020 | Yeong ............... H01L 21/76895 |
| 2020/0203490 A1* | 6/2020 | Thareja ............ H01L 21/02063 |
| 2020/0294863 A1* | 9/2020 | Chiang ............... H01L 29/0673 |

* cited by examiner

HALF BURIED NFET/PFET EPITAXY SOURCE/DRAIN STRAP

BACKGROUND

The present invention relates generally to semiconductor devices, and more specifically, to a half buried n-type field effect transistor (nFET)/p-type field effect transistor (pFET) epitaxy source/drain strap with low parasitic capacitance.

Inverters, erasable programmable read-only memories (EPROM's), electrically erasable programmable read-only memories (EEPROM's), and other devices need strapped silicides to make a local interconnect between two neighboring n-FETs and p-FETs, sometimes without the need to access that strap. Conventional devices form interconnections within the contact trench (TS) or at metallization layers (MOL/M1), which results in high parasitic capacitance. The excess parasitic capacitance between the TS and the gate is undesirable because it can slow down the circuit operation.

SUMMARY

In accordance with an embodiment, a method is provided for reducing parasitic capacitance. The method includes forming a p-type epitaxial region and an n-type epitaxial region over a substrate, depositing an epitaxial growth over the p-type epitaxial region and the n-type epitaxial region, depositing a first dielectric between the p-type epitaxial region and the n-type epitaxial region such that an airgap is defined therebetween, selectively removing the epitaxial growth to expose top surfaces of the p-type and n-type epitaxial regions, depositing a second dielectric in direct contact with the exposed top surfaces of the p-type and n-type epitaxial regions, selectively etching the first and second dielectrics to form a strapped contact, and applying a metallization layer over the strapped contact.

In accordance with an embodiment, a method is provided for reducing parasitic capacitance. The method includes forming nanosheet stacks including alternating layers of a first semiconductor material and a second semiconductor material over a substrate, depositing a dummy gate over the nanosheet stacks, forming a p-type epitaxial region and an n-type epitaxial region adjacent each of the nanosheet stacks, depositing an epitaxial growth over the p-type epitaxial region and the n-type epitaxial region, depositing a first dielectric between the p-type epitaxial region and the n-type epitaxial region such that an airgap is defined therebetween, selectively removing the epitaxial growth to expose top surfaces of the p-type and n-type epitaxial regions, depositing a second dielectric in direct contact with the exposed top surfaces of the p-type and n-type epitaxial regions, removing the dummy gate and the second semiconductor material of the nanosheet stacks resulting in openings, depositing a high-k metal gate within the openings, selectively etching the first and second dielectrics to form a strapped contact, and applying a metallization layer over the strapped contact.

In accordance with another embodiment, a semiconductor device for reducing parasitic capacitance is provided. The semiconductor device includes a p-type epitaxial region and an n-type epitaxial region disposed over a substrate, a strapped contact disposed between the p-type epitaxial region and the n-type epitaxial region, wherein the strapped contact includes first dielectric portions and second dielectric portions, an airgap defined within the second dielectric portions of the strapped contact such that the airgap is disposed between the p-type and n-type epitaxial regions, and a metallization layer disposed over the strapped contact.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

DETAILED DESCRIPTION

Embodiments in accordance with the present invention provide methods and devices for reducing parasitic capacitance between a contact trench (TS) and gates in nanosheet devices. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage applications.

Moreover, for ever-decreasing node sizes, replacement metal gate (RMG) and trench silicide processes have been employed to permit the use of smaller critical dimensions. The use of these structures can result in the need for fully strapped contacts in order to reduce contact resistance and/or parasitic capacitance. Complications arise from forming silicides through a trench. The formation of such silicides are often restricted by thermal budget, preclean processing, and high aspect ratio constraints.

Embodiments in accordance with the present invention alleviate such complications by providing methods and devices for employing a half buried n-type field effect transistor (nFET)/p-type field effect transistor (pFET) epitaxy source/drain strap with low parasitic capacitance. This results in elimination of contacts to MOL or even M1 levels. By "removing" or burying the strapping contact, an additional area gain can be observed at the MOL and M1 levels. Additionally, an airgap is present in the structure between the nFET/pFET source/drain epi regions that further reduces parasitic capacitance.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
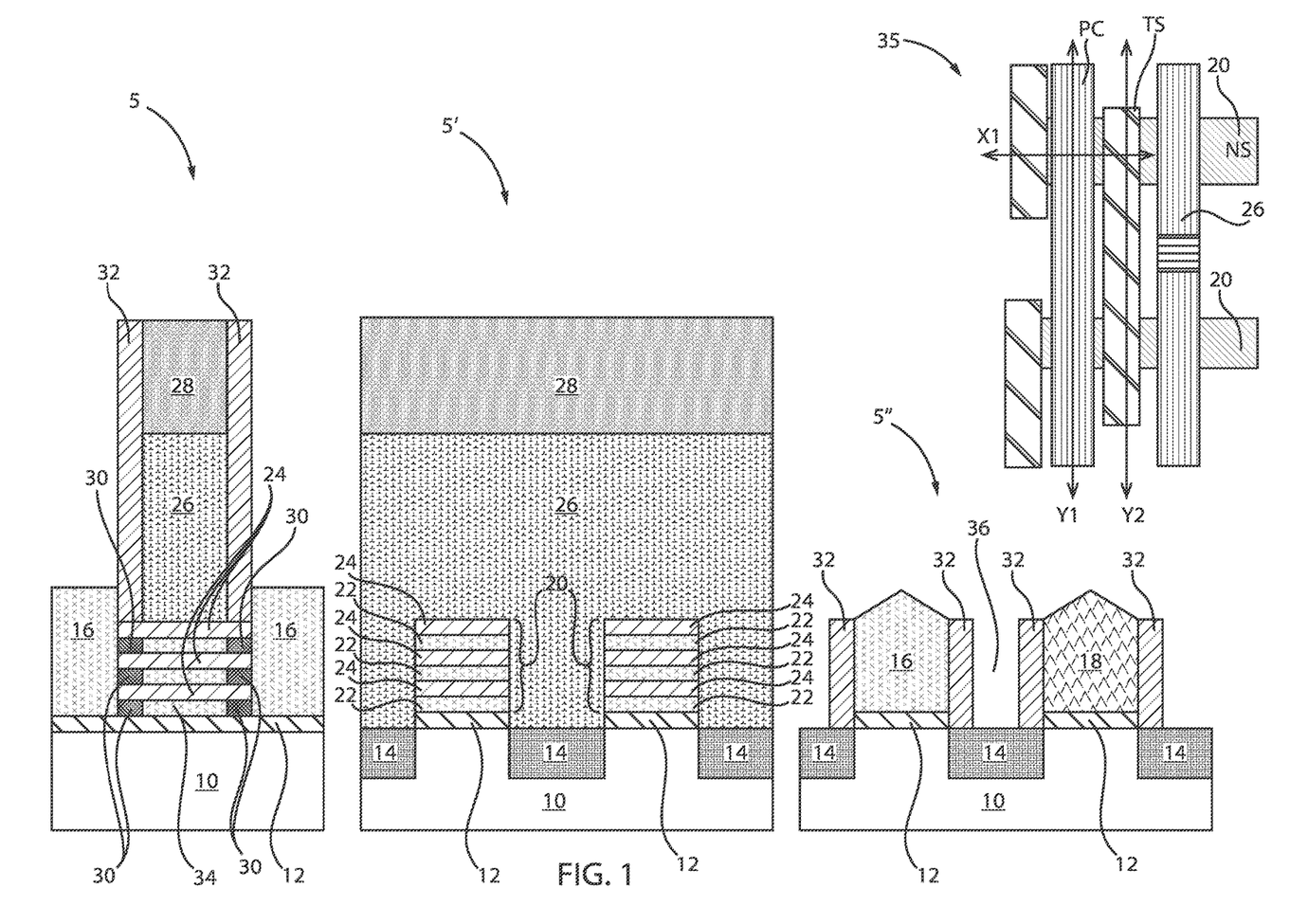
FIG. 1 is a cross-sectional view of a semiconductor structure where source/drain epitaxial formation takes place adjacent a nanosheet structure, in accordance with an embodiment of the present invention.

FIG. 1 is a cross-sectional view of a semiconductor structure where source/drain epitaxial formation takes place adjacent a nanosheet structure, in accordance with an embodiment of the present invention.

A semiconductor structure 5 includes a semiconductor substrate 10. A dielectric layer 12 is formed over the semiconductor substrate 10. A nanosheet stack 20 can be formed over the dielectric layer 12, as better illustrated in structure 5'. The nanosheet stack 20 can include, e.g., alternating layers of a first semiconductor material 22 and a second semiconductor material 24. The first semiconductor material 22 can be, e.g., silicon germanium (SiGe) and the second semiconductor material 24 can be, e.g., silicon (Si).

A dummy gate 26 can be formed over the nanosheet stack 20. A hardmask 28 can be formed over the dummy gate 26. The second semiconductor material 24 of the nanosheet stack 20 can be etched such that inner spacers 30 are formed adjacent the etched material 34. Additionally outer spacers 32 can be formed adjacent the dummy gate 26 and the hardmask 28. The inner spacers 30 are vertically aligned with the outer spacers 32.

Source/drain epitaxial regions 16 can be formed adjacent opposed ends of the nanosheet stack 20. The source/drain epitaxial regions 16 directly contact a top surface of the dielectric layer 12. The source/drain epitaxial regions 16 also directly contact the inner spacers 30, as well as the first semiconductor material 22 of the nanosheet stack 20. The source/drain epitaxial regions 16 extend above the nanosheet stack 20 such that the source/drain epitaxial regions 16 directly contact lower portions of the outer spacers 32.

Semiconductor structure 5 is a cross-sectional view along axis X1 of top view 35.

Semiconductor structure 5' is a cross-sectional view along axis Y1 of top view 35.

Semiconductor structure 5" is a cross-sectional view along axis Y2 of top view 35.

Semiconductor structure 5' illustrates the nanosheet stacks 20 formed over the dielectric layer 12. Shallow trench isolation (STI) regions 14 are also illustrated between the substrate 10 and the dummy gate 26. The dummy gate 26 is formed over and in direct contact with the nanosheet stacks 20.

Semiconductor structure 5" illustrates a p-type epitaxial region 16 and an n-type epitaxial region 18. The p-type epitaxial region 16 and the n-type epitaxial region 18 are shown directly contacting outer spacers 32 on sidewalls thereof. The p-type epitaxial region 16 is separated from the n-type epitaxial region 18 by an opening 36.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The dielectric layer 12 can include, but is not limited to, SiN, SiOCN, SiOC, SiBCN, SO2, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectric layer 12 can be conformally deposited using atomic layer deposition (ALD) or, chemical vapor deposition (CVD). Variations of CVD processes suitable for forming the dielectric layer 12 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Examples of semiconductor materials that can be used in forming such nanosheet structures 20 include at least silicon (Si), germanium (Ge), silicon germanium alloys (SiGe), silicon carbide (SiC), silicon germanium carbide (SiGeC), III-V compound semiconductors and/or II-VI compound semiconductors. One skilled in the art can contemplate a number of different semiconductor materials for forming the nanosheet structures 20.

Dummy gate 26 materials include, but are not limited to, a thin layer of dummy oxide SiO2 followed by any one or more of amorphous or polycrystalline Si, SiO2, SiON, SiGe, Ge, $GeO_2$, amorphous C, BC, CN, etc.

In various embodiments, the hardmask layer 28 can be a nitride, for example, a silicon nitride (SiN), an oxynitride, for example, silicon oxynitride (SiON), or a combination thereof. The capping materials 28 can include any one or more of SiN, SiCN, SiBN and/or SiBCN, among other materials. In a preferred embodiment, the hardmask layer 28 can be silicon nitride (SiN), for example, $Si_3N_4$.

In one or more embodiments, the hardmask layer 28 can have a thickness in the range of about 10 nm to about 100 nm, or in the range of about 35 nm to about 75 nm, or in the range of about 45 nm to about 55 nm, although other thicknesses are contemplated.

The inner spacers 30 and the outer spacers 32 can be composed of any one or more of SiN, SiBN, SiCN, SiOC, SiOCN and/or SiBCN films.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Source/drain epitaxial regions 16, 18 can be of the same or different materials for pFET and nFET devices, and can be either in-situ doped with appropriate polarity dopants (B for pFET and P for nFET devices) or doped by ion implantation.

Figure 2:
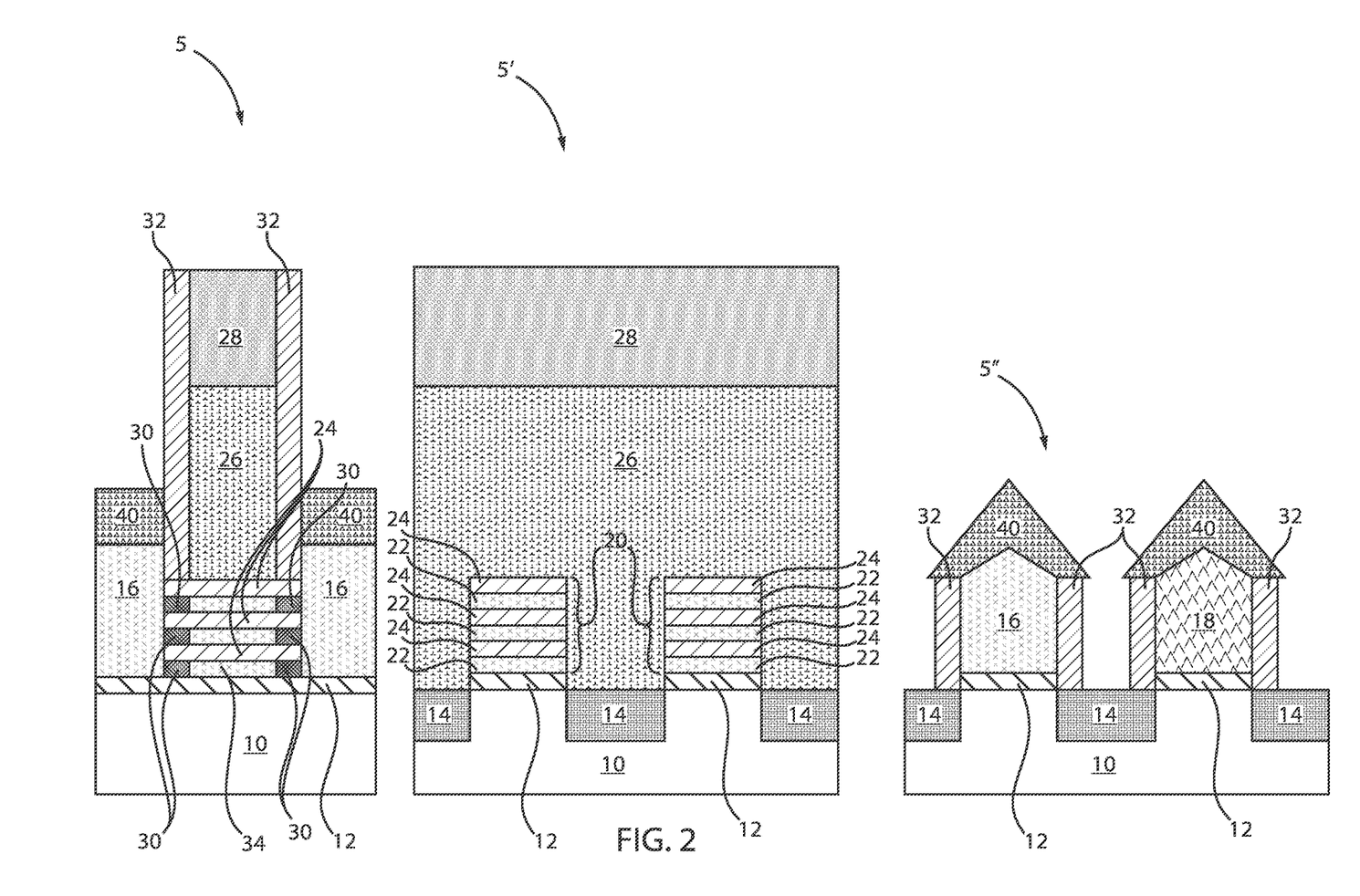
FIG. 2 is a cross-sectional view of the semiconductor structure of FIG. 1 where selective epitaxial growth takes place over the source/drain epitaxial regions, in accordance with an embodiment of the present invention.

FIG. 2 is a cross-sectional view of the semiconductor structure of FIG. 1 where selective epitaxial growth takes place over the source/drain epitaxial regions, in accordance with an embodiment of the present invention.

In various example embodiments, selective epitaxial growth regions 40 are deposited over the source/drain epitaxial regions 16, 18. The epitaxial growth regions 40 can include, e.g., germanium (Ge). In one example, the epitaxial growth regions 40 can include, e.g., high germanium (Ge) content silicon germanium (SiGe) or a thin layer of a Si with a SiGe cap.

The epitaxial growth regions 40 directly contact an entire upper surface of the source/drain epitaxial regions 16, 18. The epitaxial growth regions 40 can define substantially triangular configurations, as shown in structure 5".

Figure 3:
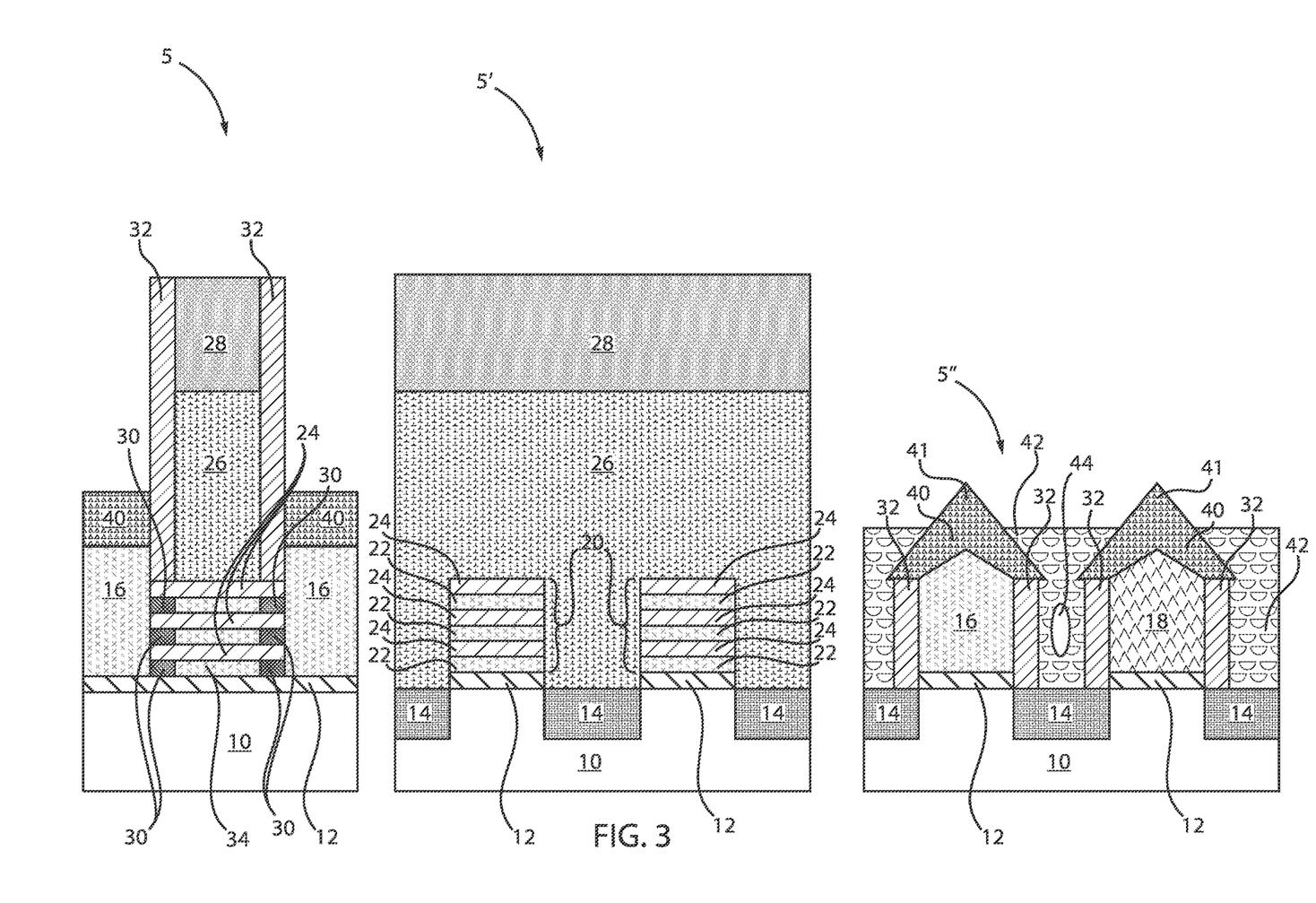
FIG. 3 is a cross-sectional view of the semiconductor structure of FIG. 2 where a dielectric is deposited forming an airgap between the source/drain epitaxial regions, in accordance with an embodiment of the present invention.

FIG. 3 is a cross-sectional view of the semiconductor structure of FIG. 2 where a dielectric is deposited forming an airgap between the source/drain epitaxial regions, in accordance with an embodiment of the present invention.

In various example embodiments, a dielectric 42 is deposited forming an airgap 44 between the source/drain epitaxial regions 16, 18, as illustrated in structure 5". An upper portion 41 of the epitaxial growth regions 40 remains exposed after etch back of the dielectric. The airgap 44 is formed between the source/drain epitaxial regions 16, 18. The dielectric 42 extends to a top surface of the STI regions 14.

The dielectric 42 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the dielectric 42 is SiOC.

Figure 4:
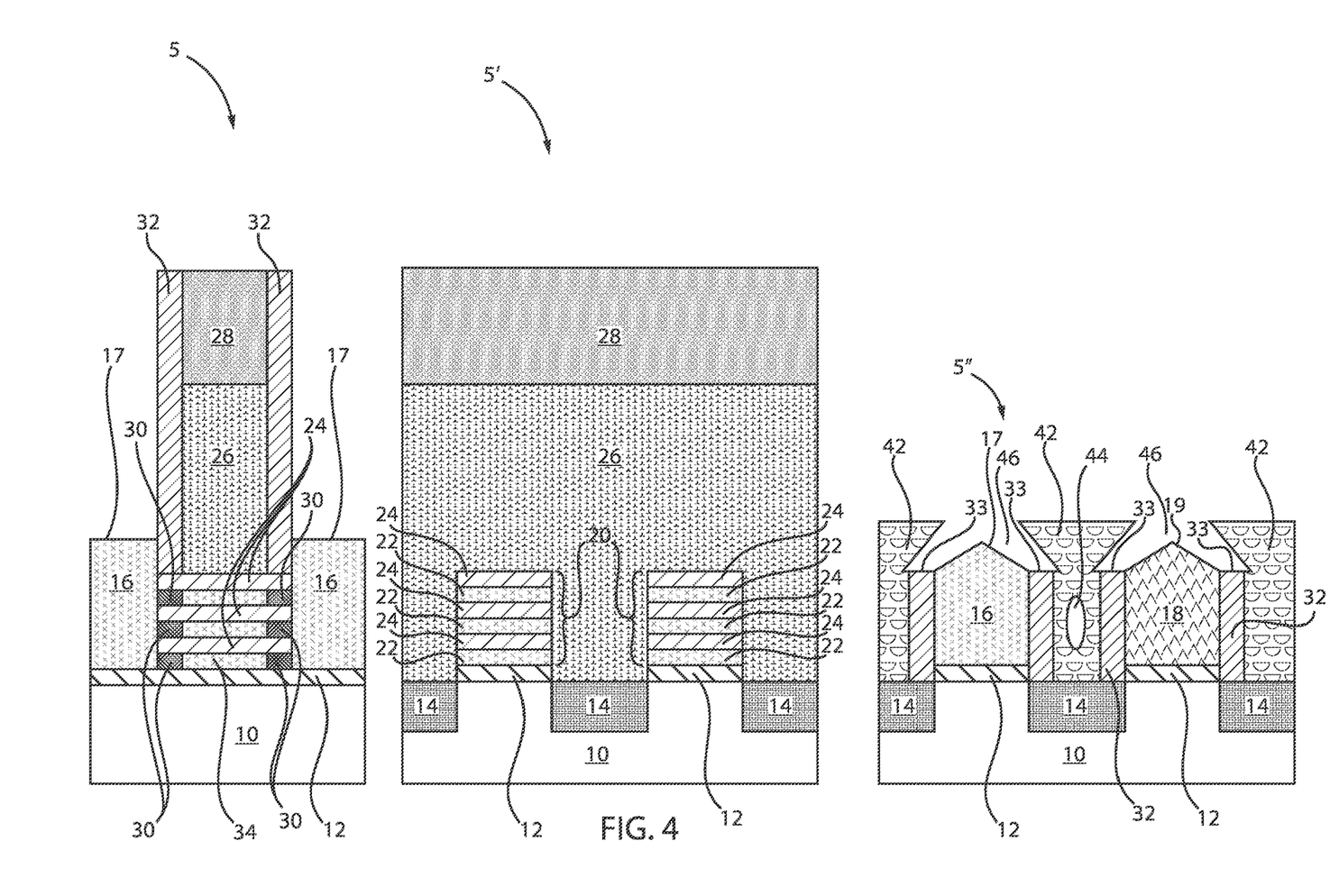
FIG. 4 is a cross-sectional view of the semiconductor structure of FIG. 3 where the epitaxial growth is removed to expose top surfaces of the source/drain epitaxial regions, in accordance with an embodiment of the present invention.

FIG. 4 is a cross-sectional view of the semiconductor structure of FIG. 3 where the epitaxial growth is removed to expose top surfaces of the source/drain epitaxial regions, in accordance with an embodiment of the present invention.

In various example embodiments, the epitaxial growth 40 is removed to expose top surfaces 17, 19 of the source/drain epitaxial regions 16, 18, respectively. The removal of the epitaxial growth 40 results in openings 46 formed over the source/drain epitaxial regions 16, 18, as illustrated in structure 5". A top surface 33 of the outer spacers 32 is also exposed by the removal of the epitaxial growth 40. The dielectric 42 and the airgap 44 remain intact.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

Figure 5:
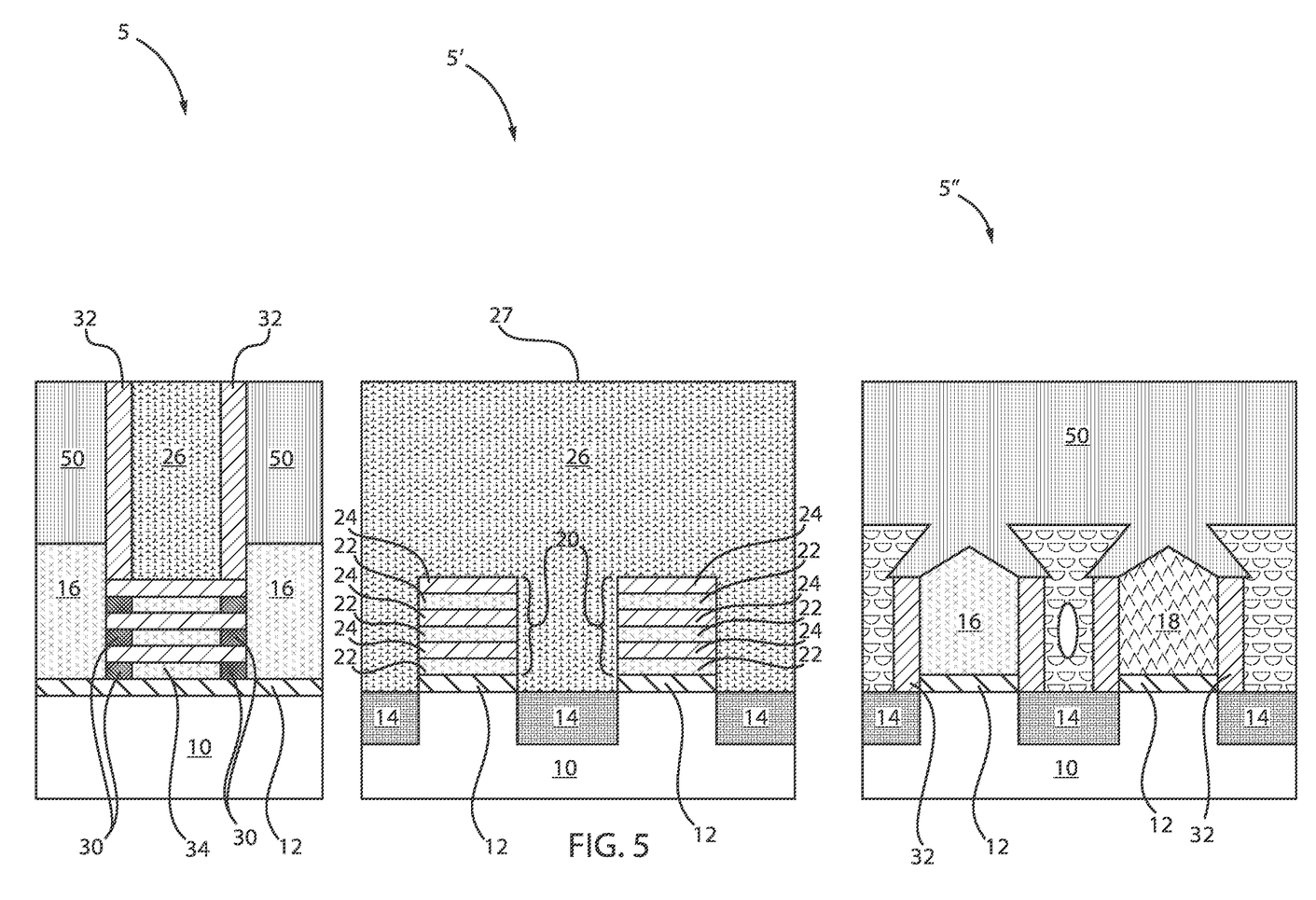
FIG. 5 is a cross-sectional view of the semiconductor structure of FIG. 4 where an interlayer dielectric (ILD) is deposited, in accordance with an embodiment of the present invention.

FIG. 5 is a cross-sectional view of the semiconductor structure of FIG. 4 where an interlayer dielectric (ILD) is deposited, in accordance with an embodiment of the present invention.

In various example embodiments, an interlayer dielectric (ILD) 50 is deposited. The ILD 50 occupies the space created by opening 46, as illustrated in structure 5". The ILD 50 directly contacts the top surface 17, 19 of the source/drain epitaxial regions 16, 18, respectively. The ILD 50 also directly contacts surfaces of the outer spacers 32. The ILD 50 can be planarized by, e.g., chemical mechanical planarization (CMP). The nitride cap or hardmask 28 is removed during the CMP process.

The ILD 50 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the ILD 50 can be a low-k oxide.

Figure 6:
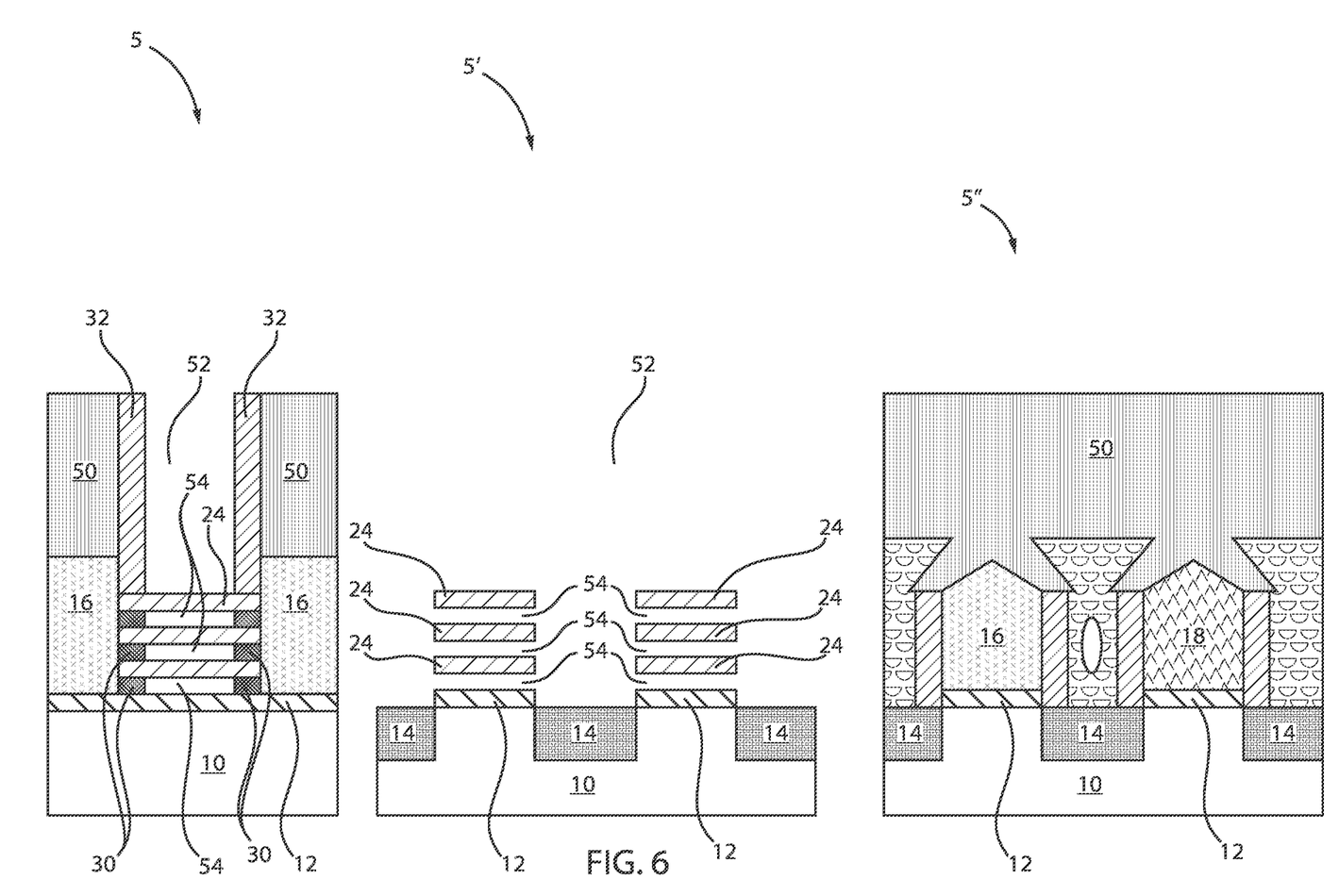
FIG. 6 is a cross-sectional view of the semiconductor structure of FIG. 5 where the dummy gate is removed and alternating layers of one material of the nanosheet stack are removed, in accordance with an embodiment of the present invention.

FIG. 6 is a cross-sectional view of the semiconductor structure of FIG. 5 where the dummy gate is removed and alternating layers of one material of the nanosheet stack are removed, in accordance with an embodiment of the present invention.

In various example embodiments, the dummy gate 26 is removed and alternating layers of one semiconductor material 22 of the nanosheet stack 20 are removed, as illustrated in structures 5, 5'. The semiconductor material 22 removed can be the SiGe material. In some embodiments, the selective removal of the SiGe layers 22 is performed by hydrochloride gas at a temperature ranging from about 500° C. to about 800° C. As a result, the Si material 24 of the nanosheet stack 20 remains intact. The removal of the dummy gate 26 results in openings 52 and the removal of the SiGe material 22 results in openings 54 defined between the Si material 24.

The dummy gate 26 can be removed by implementing an RIE process and/or a wet etching process. If the dummy gate 26 is made of amorphous or poly-Si, it can be etched in hot $NH_4OH$ or Tetramethylammonium hydroxide (TMAH) chemistries in a manner that is selective to the dielectric layer 12 and the spacers 30, 32.

Figure 7:
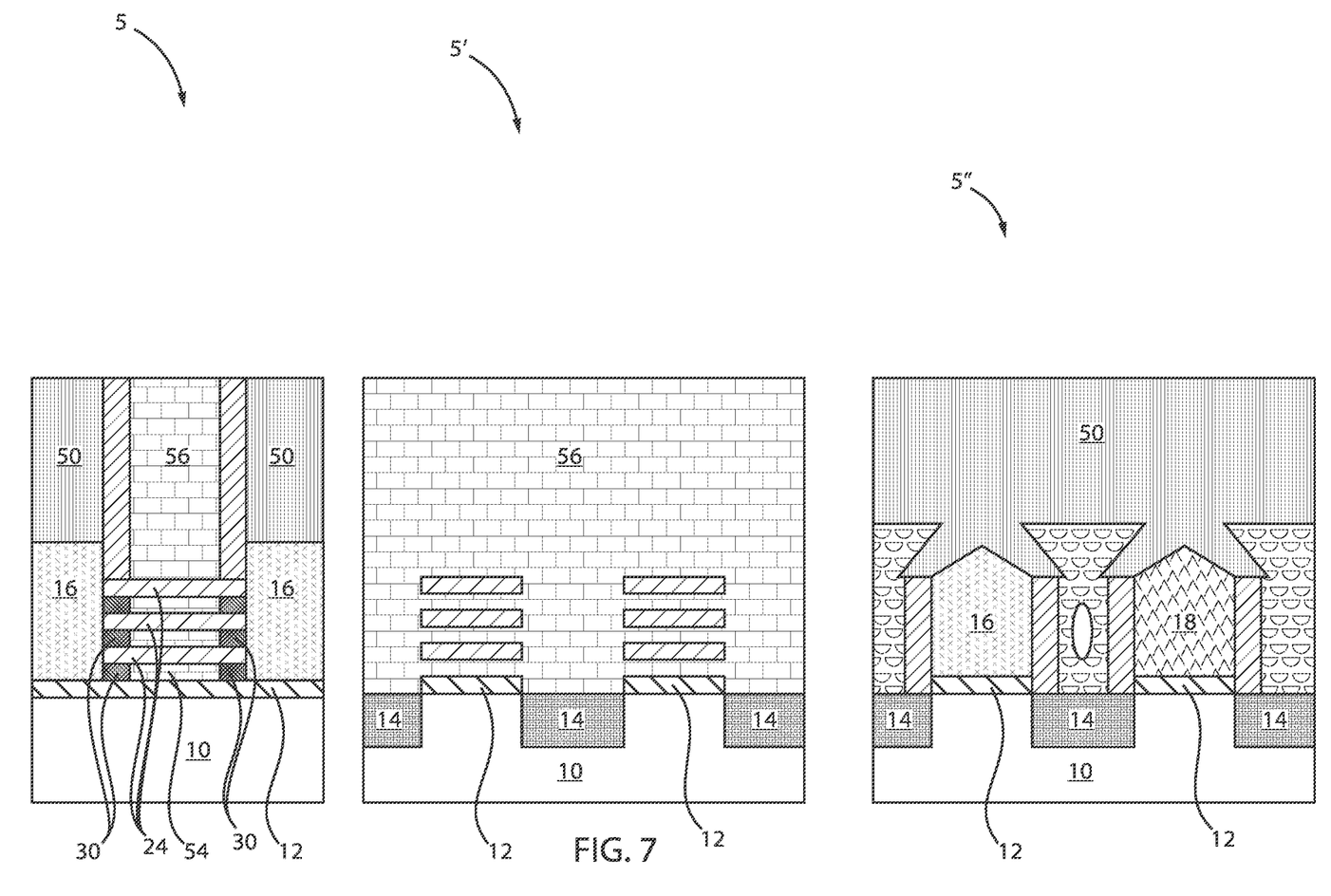
FIG. 7 is a cross-sectional view of the semiconductor structure of FIG. 6 where a high-k metal gate is deposited, in accordance with an embodiment of the present invention.

FIG. 7 is a cross-sectional view of the semiconductor structure of FIG. 6 where a high-k metal gate is deposited, in accordance with an embodiment of the present invention.

In various example embodiments, high-k metal gate 56 is deposited. The high-k metal gate can be referred to as a replacement gate.

Replacement gates 56 are formed in regions or openings 52, 54 of the device structure previously occupied by the dummy gates 26 and the SiGe material 22. In one example, a high-k material and a work function metal can be deposited. The high-k material can be any of the materials $HfO_x$, $HfSiO_x$, $Al_2O_3$, $ZrO_2$, $ZrSiO_x$, among other materials. The work function material can include any of the following metal compounds TiN, TaN, TiC, TaC, $La_2O_3$, Al, $AlO_x$, among other materials. Both high-k and work function metals can be deposited by PVD, CVD or ALD processes. The high-k metal gate 56 can be planarized by, e.g., chemical mechanical planarization (CMP).

Figure 8:
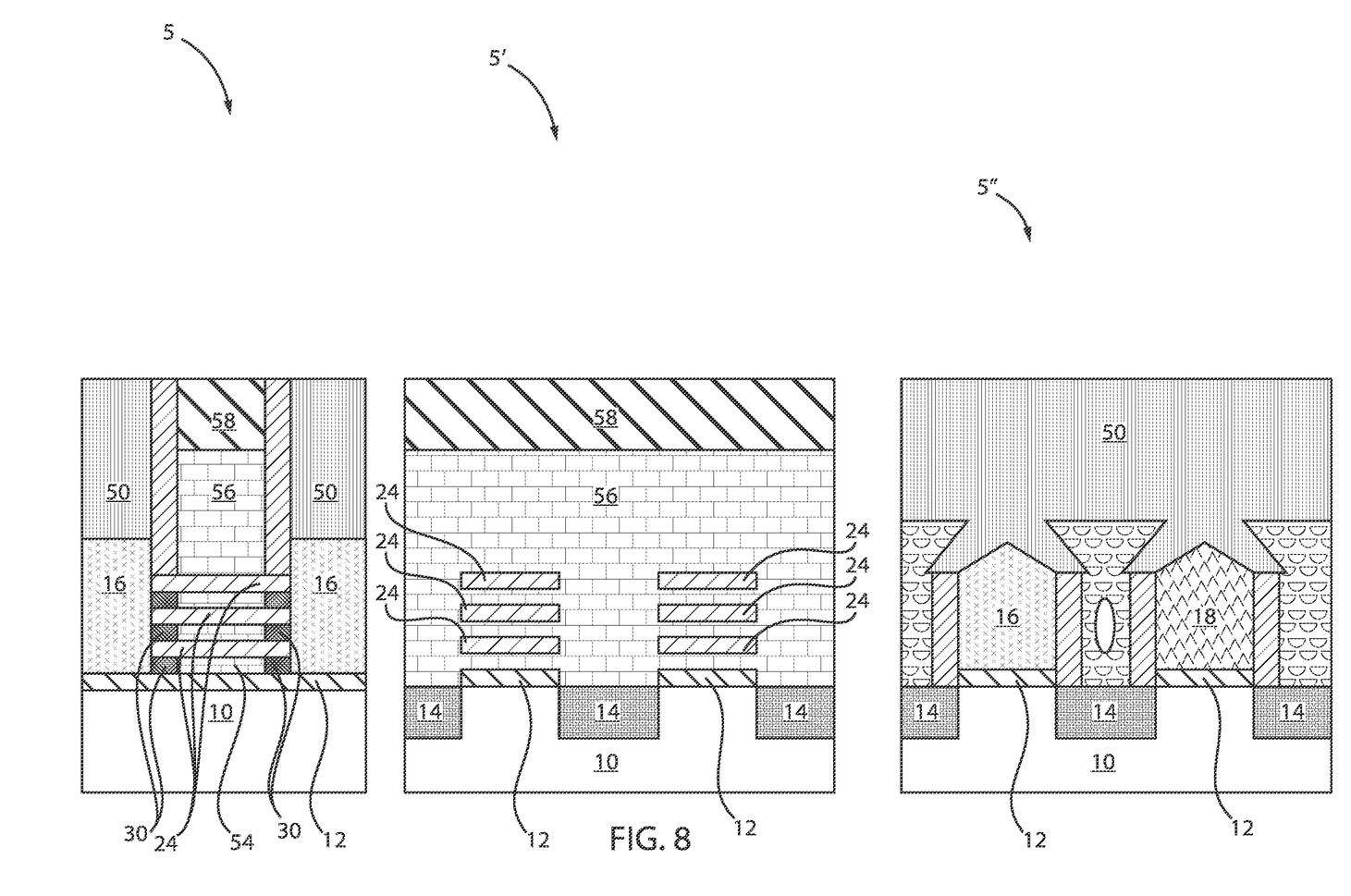
FIG. 8 is a cross-sectional view of the semiconductor structure of FIG. 7 where a self-aligned cap (SAC) is formed, in accordance with an embodiment of the present invention.

FIG. 8 is a cross-sectional view of the semiconductor structure of FIG. 7 where a self-aligned cap (SAC) is formed, in accordance with an embodiment of the present invention.

In various example embodiments, a self-aligned cap (SAC) 58 is formed over the high-k metal gate 56.

By way of example, the high-k metal gate 56 can be recessed using a selective tungsten etching process, followed by a cap deposition process. The cap deposition process can be a nitride deposition process, which is provided by a blanket deposition process. The deposition process is followed by a CMP process to form the self-aligned contact cap 58.

Figure 9:
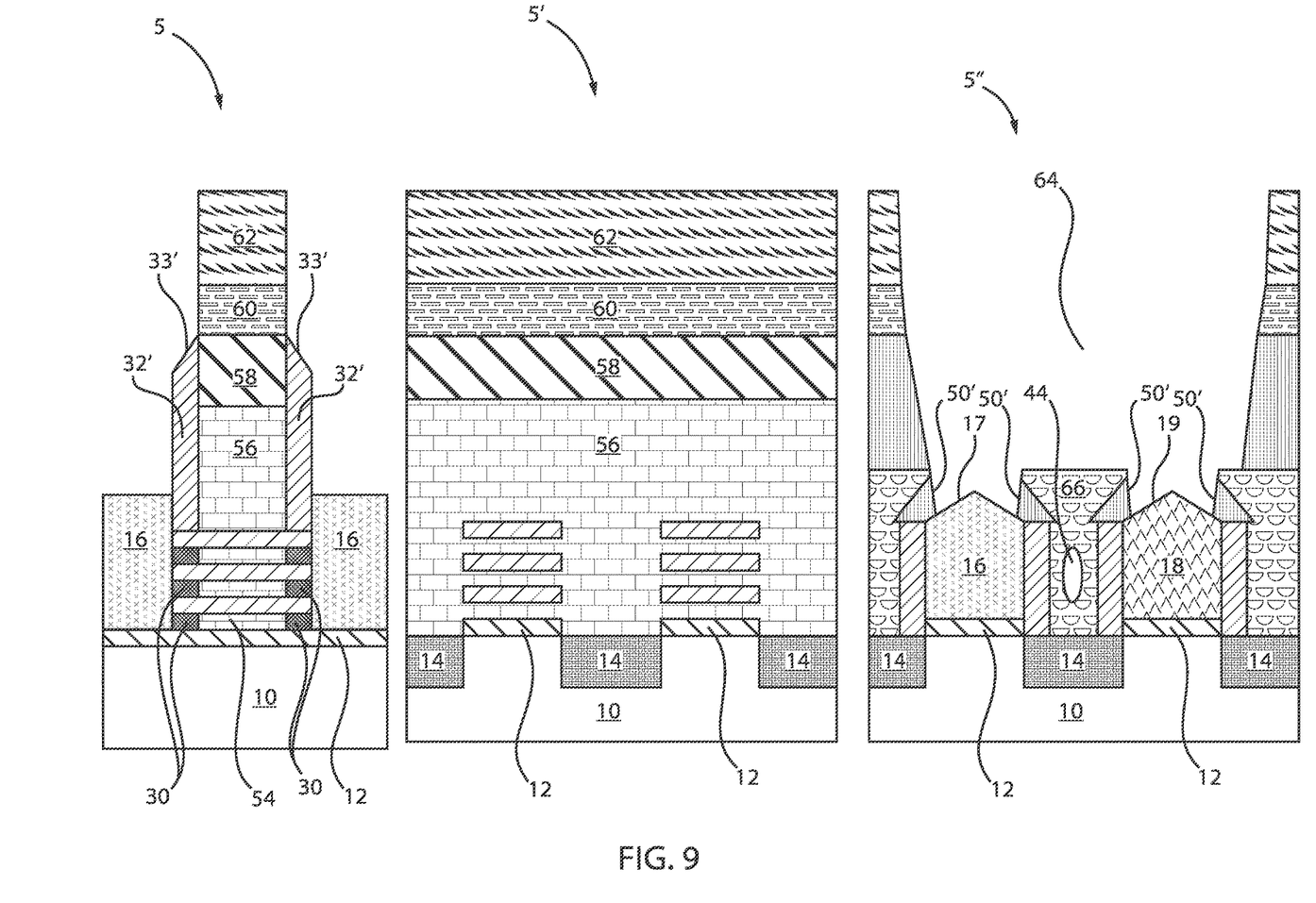
FIG. 9 is a cross-sectional view of the semiconductor structure of FIG. 8 where the ILD is etched to expose top surfaces of the source/drain epitaxial regions, in accordance with an embodiment of the present invention.

FIG. 9 is a cross-sectional view of the semiconductor structure of FIG. 8 where the ILD is etched to expose top surfaces of the source/drain epitaxial regions, in accordance with an embodiment of the present invention.

In various example embodiments, an ILD 60 and an organic planarization layer (OPL) 62 are deposited. The ILD 60, the OPL 62, and the ILD 50 are selectively etched to expose top surfaces 17, 19 of the source/drain epitaxial regions 16, 18, respectively. The etch can be, e.g., an RIE etch. The etch results in opening 64, as shown in structure 5".

In structure 5, the ILD 60 is shown directly contacting the SAC 58. Structure 5 further illustrates a top portion of the outer spacers 32 partially etched such that outer spacers 32' are formed with an inclined or oblique surface 33'.

Figure 10:
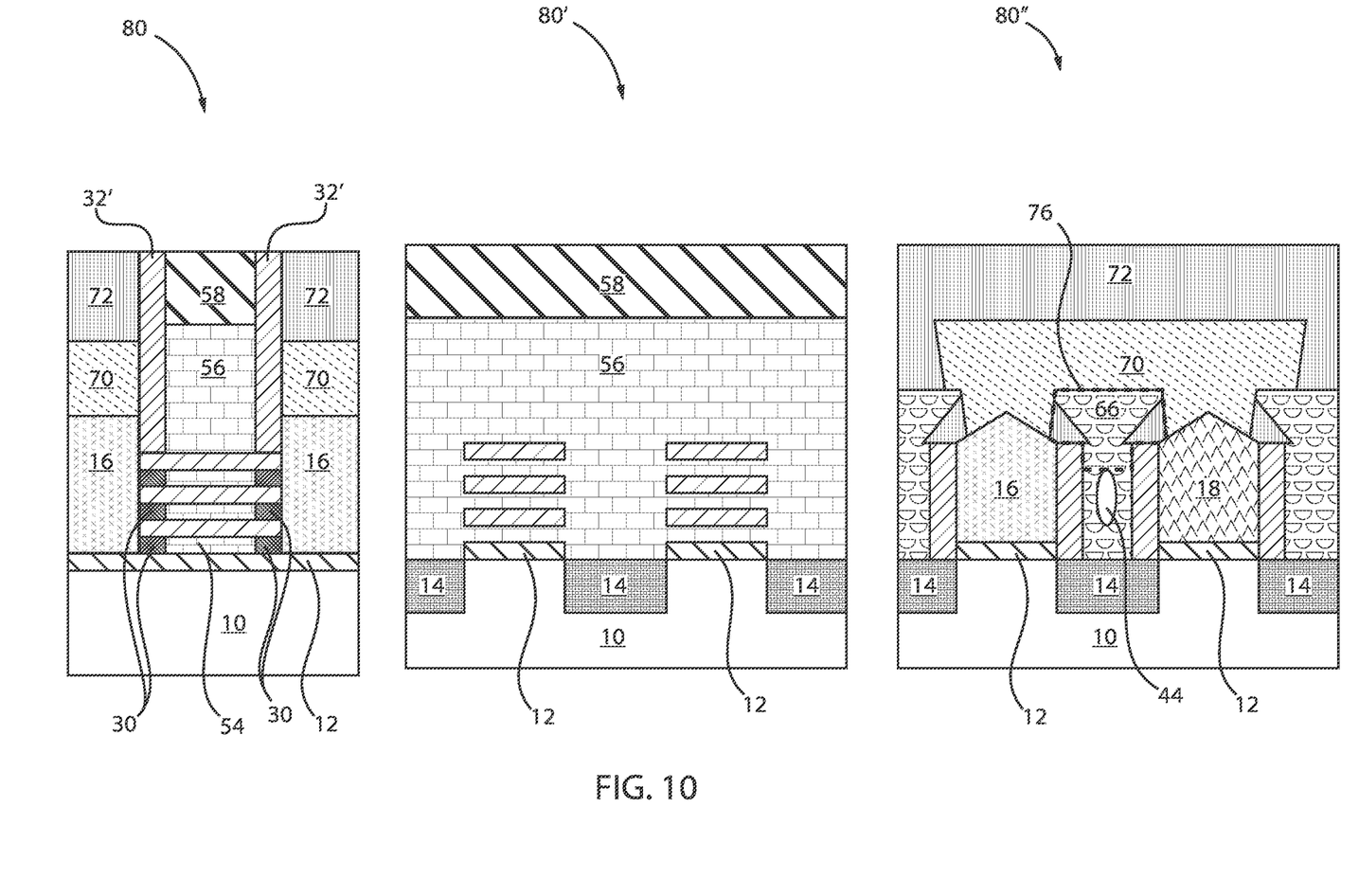
FIG. 10 is a cross-sectional view of the semiconductor structure of FIG. 9 where contact trench (TS) metallization takes place and parasitic capacitance between the source/drain epitaxial regions is minimized, in accordance with an embodiment of the present invention.

In structure 5", ILD sections 50' remain. The ILD sections 50' are formed between the outer spacer 32 and the dielectric 42. The ILD sections 50' are further formed between the dielectric 42 and the source/drain epitaxial regions 16, 18. After the etch, a dielectric section 66 (or contact structure or strapped contact) including the air gap 44 remains between the source/drain epitaxial regions 16, 18. This dielectric section 66 with certain ILD sections 50' can be referred to as a strapped trench contact (TS), as shown in FIG. 10 below. Certain ILD sections 50' prevent direct contact between the source/drain epitaxial regions 16, 18 and the dielectric 42.

The dielectric section 66 can define a substantially "T shaped" region including the airgap 44. The T-shaped region can extend to the top surface of the STI 14. The dielectric section 66 (or strapped contact) connects the p-type epitaxial region 16 to the n-type epitaxial region 18. Additionally, the airgap 44 is formed below the top surfaces of the source/drain epitaxial regions 16, 18 and remains in the vertical section of the "T-shape" of the dielectric 42.

Therefore, the device structure includes a half-buried n/pFET epitaxy source/drain strap. Since the contacts to MOL or even M1 can be eliminated with such structure, the structure will have significantly reduced capacitance as compared to conventional structures. By "removing" or burying the strapping contact, an additional area gain is observed at the MOL and M1 level. Another benefit of the structure is the airgap 44 between the two epitaxies 16, 18 that further reduces capacitance.

The OPL 60 can be formed at a predetermined thickness to provide reflectivity and topography control during etching of the layers below. The OPL 60 can include an organic material, such as a polymer. The thickness of the OPL 60 can be in a range from about 10 nm to about 300 nm. In one example, the thickness of the OPL 60 is about 100 nm-150 nm.

FIG. 10 is a cross-sectional view of the semiconductor structure of FIG. 9 where contact trench (TS) metallization takes place and parasitic capacitance between the source/drain epitaxial regions is minimized, in accordance with an embodiment of the present invention.

In various example embodiments, a metallization layer 70 and a dielectric 72 are deposited and final structures 80, 80', 80" are illustrated. The metallization layer 70 directly contacts a top surface 17, 19 of the source/drain epitaxial regions 16, 18. The metallization layer 70 further directly contacts the top surface of the dielectric section 66 and sidewalls of certain ILD sections 50', as illustrated in structure 80". Parasitic capacitance in the region 76 defined by dielectric section 66 is significantly minimized or completely eliminated. The metallization layer 70 can define an irregular shape adjacent the strapped contact 66 and adjacent the source/drain epitaxial regions 16, 18.

The dielectric section 66 (or contact structure or strapped contact) connects the source/drain epitaxial regions 16, 18. The dielectric section 66 is substantially "T-shaped." The "T-shaped" configuration thus includes an upper area and a lower area. The upper area is substantially horizontal, whereas the lower area is substantially vertical. The vertical lower area defines an airgap 44 between the source/drain epitaxial regions 16, 18. The vertical lower area extends to a top surface of the STI region 14. The dielectric section 66 extends, in a vertical manner, above the top surfaces of the source/drain epitaxial regions 16, 18. In other words, the dielectric section 66 is taller than the source/drain epitaxial regions 16, 18. The upper area of the dielectric section 66 acts as an umbrella or shield in preventing the metallization layer 70 from extending into regions between the source/drain epitaxial regions 16, 18. The dielectric section 66 also has a narrower profile compared to the profiles of the source/drain epitaxial regions 16, 18.

In summary, the device structure of the exemplary embodiments of the present invention includes a contact structure that connects nFET epi and pFET epi, a first dielectric disposed between the nFET and pFET epi with an airgap defined therein, the first dielectric having a taller height compared to the top surface of the epi, the first dielectric having an umbrella-like top shape, and the contact structure being recessed with a dielectric cap over it. The method of the exemplary embodiments of the present invention includes forming pFET and nFET S/D epi, forming sacrificial epi over the top surface of the pFET and nFET epi, forming a first dielectric between the epi and sacrificial epi with airgap at the bottom, removing the sacrificial epi, forming a second dielectric over the epi and the first dielectric, forming a contact by selectively etching the second dielectric to the first dielectric to connect to the epi, and metallizing and recessing the contact.

Therefore, the exemplary embodiments of the present invention provide for a unique TS contact structure which crosses over different active regions with both reduced bottom and top overlap to enable parasitic capacitance reduction. Thus, the exemplary embodiments of the present invention relate to contact formation, and are not related to circuit layouts or fin isolation methods or airgap spacer formation or memory device designs.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a half buried n-type field effect transistor (nFET)/p-type field effect transistor (pFET) epitaxy source/drain strap with low capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for reducing parasitic capacitance, the method comprising:
    forming a p-type epitaxial region and an n-type epitaxial region over a substrate;
    depositing an epitaxial growth over the p-type epitaxial region and the n-type epitaxial region;
    depositing a first dielectric between the p-type epitaxial region and the n-type epitaxial region such that an airgap is defined therebetween;
    selectively removing the epitaxial growth to expose top surfaces of the p-type and n-type epitaxial regions;
    depositing a second dielectric in direct contact with the exposed top surfaces of the p-type and n-type epitaxial regions;
    selectively etching the first and second dielectrics to form a strapped contact; and
    applying a metallization layer over the strapped contact.

2. The method of claim 1, wherein the strapped contact has a substantially "T-shaped" configuration.

3. The method of claim 1, wherein the strapped contact includes portions of the first dielectric.

4. The method of claim 3,
    wherein the portions of the second dielectric prevent direct contact between the p-type and n-type epitaxial regions, and the first dielectric.

5. The method of claim 1, wherein the strapped contact extends above a top surface of the p-type and n-type epitaxial regions.

6. The method of claim 1, wherein the strapped contact connects the p-type epitaxial region to the n-type epitaxial region.

7. The method of claim 1, wherein the metallization layer directly contacts the top surfaces of the p-type and n-type epitaxial regions.

8. The method of claim 1, wherein the airgap is formed below the top surfaces of the p-type and n-type epitaxial regions.

9. A method for reducing parasitic capacitance, the method comprising:
    forming nanosheet stacks including alternating layers of a first semiconductor material and a second semiconductor material over a substrate (10);
    depositing a dummy gate over the nanosheet stacks;
    forming a p-type epitaxial region and an n-type epitaxial region adjacent each of the nanosheet stacks;
    depositing an epitaxial growth over the p-type epitaxial region and the n-type epitaxial region;
    depositing a first dielectric between the p-type epitaxial region and the n-type epitaxial region such that an airgap is defined therebetween;
    selectively removing the epitaxial growth to expose top surfaces of the p-type and n-type epitaxial regions;
    depositing a second dielectric in direct contact with the exposed top surfaces of the p-type and n-type epitaxial regions;
    removing the dummy gate and the first semiconductor material of the nanosheet stacks resulting in openings;
    depositing a high-k metal gate within the openings;
    selectively etching the first and second dielectrics to form a strapped contact; and
    applying a metallization layer over the strapped contact.

10. The method of claim 9, wherein the strapped contact has a substantially "T-shaped" configuration.

11. The method of claim 9, wherein the strapped contact includes portions of the first dielectric.

12. The method of claim 11,
    wherein the portions of the second dielectric prevent direct contact between the p-type and n-type epitaxial regions, and the first dielectric.

13. The method of claim 9, wherein the strapped contact extends above a top surface of the p-type and n-type epitaxial regions.

14. The method of claim 9, wherein the strapped contact connects the p-type epitaxial region to the n-type epitaxial region.

15. The method of claim 9, wherein the metallization layer directly contacts the top surfaces of the p-type and n-type epitaxial regions.

16. The method of claim 9, wherein the airgap is formed below the top surfaces of the p-type and n-type epitaxial regions.

* * * * *